US008610128B2

(12) United States Patent
Chae et al.

(10) Patent No.: US 8,610,128 B2
(45) Date of Patent: Dec. 17, 2013

(54) THIN FILM TRANSISTOR METHOD OF FABRICATING THE SAME

(71) Applicant: LG Display Co., Ltd., Seoul (KR)

(72) Inventors: Gee-Sung Chae, Incheon (KR); Mi-Kyung Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/849,906

(22) Filed: Mar. 25, 2013

(65) Prior Publication Data

US 2013/0228750 A1    Sep. 5, 2013

Related U.S. Application Data

(62) Division of application No. 12/721,124, filed on Mar. 10, 2010, now Pat. No. 8,426,869.

(30) Foreign Application Priority Data

Apr. 7, 2005 (KR) ........................ 10-2005-0029120

(51) Int. Cl.
*H01L 21/336* (2006.01)
*H01L 33/00* (2010.01)

(52) U.S. Cl.
USPC ........ 257/72; 257/59; 257/E21.413; 438/149; 977/762

(58) Field of Classification Search
USPC ........ 257/59, 72, 88, 258, 910, 911, E27.076, 257/E27.133; 438/38, 66, 73, 98, 128, 208, 438/381, 453, 482, 584, 587; 977/762
See application file for complete search history.

(56) References Cited

U.S. PATENT DOCUMENTS

| 6,805,602 | B2 | 10/2004 | So et al. |
| 6,969,872 | B2 | 11/2005 | Kim |
| 7,067,867 | B2 | 6/2006 | Duan et al. |
| 7,102,605 | B2 | 9/2006 | Stumbo et al. |
| 2004/0112964 | A1 | 6/2004 | Empedocles et al. |
| 2004/0136866 | A1 | 7/2004 | Pontis et al. |
| 2004/0262636 | A1 | 12/2004 | Yang et al. |
| 2005/0056826 | A1 | 3/2005 | Appenzeller et al. |
| 2005/0213010 | A1 | 9/2005 | Kwon et al. |
| 2006/0008942 | A1 | 1/2006 | Romano et al. |

FOREIGN PATENT DOCUMENTS

| CN | 1300105 | 6/2001 |
| JP | 2003-347314 A | 12/2003 |
| JP | 2006-032906 | 2/2006 |
| WO | WO 2004/032190 A2 | 4/2004 |

OTHER PUBLICATIONS

D.P. Yu, et al; "*Nanoscale Silicon Wires Synthesized Using Simple Physical Evaporation*"; Applied Physics Letters; vol. 72, No. 26; pp. 3458-3460 (Apr. 30, 1998).

*Primary Examiner* — Lynne Gurley
*Assistant Examiner* — Vernon P Webb
(74) *Attorney, Agent, or Firm* — McKenna, Long & Aldridge, LLP

(57) ABSTRACT

A thin film transistor includes: a silicon nanowire on a substrate, the silicon nanowire having a central portion and both side portions of the central portion; a gate electrode on the central portion; and a source electrode and a drain electrode spaced apart from the source electrode on the both side portions, the source electrode and the drain electrode electrically connected to the silicon nanowire, respectively.

13 Claims, 12 Drawing Sheets

THIN FILM TRANSISTOR METHOD OF FABRICATING THE SAME

This application is a divisional of U.S. patent application Ser. No. 12/721,124 filed on Mar. 10, 2010, which is a divisional application of U.S. patent application Ser. No. 11/397,556, filed on Apr. 5, 2006, both of which claim benefit of Korean Patent Application No. 10-2005-0029120, filed on Apr. 7, 2005, all of which are hereby incorporated by reference for all purposes as if fully set forth herein.

BACKGROUND OF THE INVENTION

1. Field of the Invention

The present invention relates to a flat panel display (FPD), and more particularly to a thin film transistor (TFT) for a FPD and a manufacturing method thereof.

2. Discussion of the Related Art

Generally, the FPD includes a liquid crystal display (LCD) device, a plasma display panel (PDP) and an organic electroluminescent display device (OLED) or the like. Here, the TFT is utilized as a switching element or a driving element of the FPD.

FIG. 1 is a schematic view of a structure of an LCD according to the related art.

In FIG. 1, an LCD 3 includes upper and lower substrates 5 and 22 facing each other and a liquid crystal layer 11 between the upper and lower substrates 5 and 22.

A gate line 12 and a data line 24 crossing the gate line 12 are formed on the lower substrate 22 to define a pixel region P. A TFT T is disposed at a position adjacent to a crossing of the gate line 12 and the data line 24, and a pixel electrode 17 is connected to the TFT T and is disposed in the pixel region P. The pixel electrode 17 includes a transparent conductive material such as indium tin oxide (ITO) or indium zinc oxide (IZO).

The TFT T includes a gate electrode 30 connected to the gate line 12, a source electrode 34 connected to the data line 24, a drain electrode 36 spaced apart from the source electrode 34, and a semiconductor layer 32 between the source electrode 34 and the gate electrode 30 and between the drain electrode 36 and the gate electrode 30.

Here, the gate line 12 provides a scanning signal from a first external circuit with the gate electrode 30 and the data line 24 provides a data signal from a second external circuit with the source electrode 34.

Further, red, green and blue sub-color filters 7a, 7b and 7c are formed on the upper substrate 5, wherein each of the red, green and blue sub-color filters 7a, 7b and 7c is repeatedly disposed in a region corresponding to the pixel region P. A black matrix 6 is formed in an intervening space between the red, green and blue sub-color filters 7a, 7b and 7c. Generally, a common electrode 9 is formed on the red, green and blue sub-color filters 7a, 7b and 7c and the black matrix 6.

Liquid crystal molecules of the liquid crystal layer 11 have an anisotropic dielectric constant and anisotropic refractive index characteristics due to their long, thin shape. In addition, for example, two electric field generating electrodes are formed on the two substrates, respectively. Accordingly, the orientation of the liquid crystal molecules can be controlled by supplying a voltage to the two electrodes. Transmittance of the LCD panel is thus changed according to polarization properties of the liquid crystal material.

The TFT may have various configurations. Typically, an inverted staggered type TFT of amorphous silicon or a top gate type TFT of polysilicon are utilized.

FIG. 2 is a schematic cross-sectional view of an inverted staggered type TFT according to the related art.

In FIG. 2, an inverted staggered type TFT T includes a gate electrode 52 on a substrate 50, a gate insulating layer 54 on an entire surface of the substrate 50 having the gate electrode 52, an active layer 56 on the gate insulating layer 54 over the gate electrode 52, an ohmic contact layer 58 on the active layer 56. Here, the ohmic contact layer 58 has an opening portion 59 that exposes a central portion of the active layer 56. Source and drain electrodes 60 and 62 are formed on the ohmic contact layer 58. The source and drain electrodes 60 and 62 are spaced apart from each other by the opening portion 59. Substantially, the opening portion 59 defines a channel portion (not shown) of the TFT T.

Further, a passivation layer 64 is formed on the TFT T. The passivation layer 64 has a drain contact hole 66 that exposes a portion of the drain electrode 62. The pixel electrode 68 is formed on the passivation layer 64 and is connected to the drain electrode 62 via the drain contact hole 66.

Hereinafter, a manufacturing process of the inverted staggered TFT will be explained according to the figures.

FIGS. 3A to 3E are schematic cross-sectional views showing an array substrate including an inverted staggered TFT in accordance with a manufacturing process thereof of the related art.

As illustrated in FIG. 3A, a gate electrode 52 is formed by depositing and patterning a conductive material such as aluminum (Al), Al alloy, copper, tungsten (W), or molybdenum (Mo) on a substrate 50.

Next, a gate insulating layer 54 is formed by depositing an inorganic insulating material such as silicon nitride or silicon oxide on the substrate 50 where the gate electrode 52 is formed.

As illustrated FIG. 3B, amorphous silicon and doped amorphous silicon layer are deposited on the gate insulating layer 54 and are patterned into an active layer 56 and an ohmic contact layer 58, respectively. For example, the amorphous silicon is deposited by a plasma enhanced chemical vapor deposition (PECVD) after decomposing a silane gas ($SiH_4$) by a radio frequency (RF) power. Forming the doped amorphous silicon includes preparing a chamber (not shown) where the substrate 50 having the amorphous silicon formed thereon is disposed and injecting a doping gas such as silane ($SiH_4$), a dilution gas of hydrogen, phosphine ($PH_3$) or diborane ($B_2H_6$) into the chamber. Here, when the gas pressure reaches a predetermined level, impurities such as phosphorous (P) or boron (B) may be incorporated as dopants into the amorphous silicon by providing RF power in the chamber.

The active layer 56 and the ohmic contact layer 58 can be formed having predetermined patterns by performing a mask process for patterning the amorphous silicon layer and the doped amorphous silicon layer.

As illustrated in FIG. 3C, source and drain electrodes 60 and 62 are formed by depositing and patterning a conductive material such as the same material as the gate electrode material on the ohmic contact layer 58. Here, the source and drain electrodes 60 and 62 are spaced apart from each other by an opening portion 59 that exposes a portion of the ohmic contact layer 58.

Sequentially, a portion of the ohmic contact layer 58 corresponding to the opening portion 59 is removed and a portion of the active layer 56 corresponding to the opening portion 59 is exposed. The exposed portion of the active layer 56 is defined as a channel region (not shown).

The active layer 56 and the ohmic contact layer 58 form a semiconductor layer 57.

Using the above-described process, a TFT T including the gate electrode 52, the semiconductor layer 57, and source and drain electrodes 60 and 62 may be formed.

As illustrated in FIG. 3D, a passivation layer 64 is formed by depositing an inorganic insulating material such as silicon nitride (SiNx) or silicon oxide (SiOx) or by coating an organic insulating layer such as benzocyclobutene (BCB) or acrylic resin on the substrate 50 where the source and drain electrodes 60 and 62 are formed.

Next, a drain contact hole 66 is formed by patterning the passivation layer 64, wherein the drain contact hole 66 exposes a portion of the drain electrode 62.

As illustrated in FIG. 3E, a pixel electrode 68 is formed by depositing and patterning a transparent conductive material such as indium tin oxide (ITO) or indium zinc oxide (IZO) on the passivation layer 64. Here, the pixel electrode 68 is connected to the drain electrode 62 via the drain contact hole 66.

Although the semiconductor layer 57 of the inverted staggered TFT T includes amorphous silicon, in fact, the amorphous silicon is unsuitable for a large size LCD. It is because the amorphous silicon has low electron and hole mobility.

As one means to solve the problem, a top gate TFT using polysilicon having a higher mobility than the amorphous silicon has been suggested.

FIG. 4 is a schematic cross-sectional view of a top gate type TFT according to the related art.

In FIG. 4, a top gate type TFT T includes an active layer 72 of polysilicon on a substrate 70, an ohmic contact layer 74 on the active layer 72 which has an opening portion 73 that exposes a central portion of the active layer 72, and source and drain electrodes 76 and 78 spaced apart from each other by the opening portion 73.

The opening portion 73 defines a channel region (not shown). A gate insulating layer 80 is formed on an entire surface of the substrate 70 where the active layer 72, the ohmic contact layer 74 and the opening portion 73 is formed. A gate electrode 82 is formed on the gate insulating layer 80 to be disposed at a position corresponding to the opening portion 73. A passivation layer 84 is formed on the gate electrode 82 and has a drain contact hole 85 that exposes a portion of the drain electrode 78. A pixel electrode 86 is formed on the passivation layer 84 and is connected to the drain electrode 78 via the drain contact hole 85. The active layer 72 is made of polysilicon formed by crystallizing amorphous silicon.

As explained above, the inverted staggered type or the top gate type TFT is manufactured through a complicated process for forming the active layer 72 and the ohmic contact layer 74. Furthermore, forming the array substrate includes forming the TFT T, then forming the source and drain electrodes 76 and 78, then forming the gate and data lines (not shown) which respectively apply signals to the source and drain electrodes 76 and 78.

Therefore, manufacturing the array substrate increase the process time and the production cost.

A TFT using a silicon nanowire has been suggested in order to solve the problem.

FIG. 5 is a schematic cross sectional view showing a structure of a TFT including a silicon nanowire according to the related art.

In FIG. 5, a gate electrode 92 is formed on a substrate 90, source and drain electrodes 98 and 99 are formed on both sides of the gate electrode 92, and a silicon nanowire 95 is disposed on the gate electrode 92 to directly contact the source and drain electrodes 98 and 99 through both sides thereof. Typically, forming the silicon nanowire 95 is performed before forming the source and drain electrodes 98 and 99.

To connect the silicon nanowire 95 and the source and drain electrodes 98 and 99, an insulating layer 96, such as an oxide layer of the silicon nanowire 95 surrounding a crystalline silicon 94 of the silicon nanowire 95 at both sides of the silicon nanowire 95, should be removed before forming the source and drain electrodes 98 and 99.

Accordingly, electrical contact instability results, in part, from the following events: the silicon nanowire (95) disposed on the gate electrode (92) and the connection of the silicon nanowire (95) semiconductor material to the metals of the source and drain (98 and 99). These events result in device operation instability.

BRIEF SUMMARY OF THE INVENTION

Accordingly, the present invention is directed to a TFT including a silicon nanowire and a method of fabricating the same that substantially obviates one or more of the problems due to limitations and disadvantages of the related art.

An advantage of the present invention is to provide a TFT including a silicon nanowire that can have a stable operation.

Another advantage of the present invention is to provide a TFT including a silicon nanowire that does not interfere with efficient processing.

Another advantage of the present invention is to provide a method of fabricating a TFT including a silicon nanowire that can form a TFT including a silicon nanowire by a simpler process than the related art.

Additional features and advantages of the invention will be set forth in the description which follows, and in part will be apparent from the description, or may be learned by practice of the invention. These and other advantages of the invention will be realized and attained by the structure and method particularly pointed out in the written description and claims hereof as well as the appended drawings.

To achieve these and other advantages and in accordance with the purpose of the present invention, as embodied and broadly described, a thin film transistor includes: a silicon nanowire on a substrate, the silicon nanowire having a central portion and respective side portions of the central portion; a gate electrode on the central portion; and a source electrode and a drain electrode spaced apart from the source electrode on the respective side portions, the source electrode and the drain electrode electrically connected to the silicon nanowire.

In another aspect of the present invention, an array substrate for a flat panel display device includes: a silicon nanowire on a substrate, the silicon nanowire having a central portion and both side portions of the central portion; a gate electrode on the central portion; a first source electrode and a first drain electrode spaced apart from the first source electrode on the respective side portions, the first source electrode and the first drain electrode electrically connected to the silicon nanowire, respectively; a second source electrode connected to the first source electrode and a second drain electrode connected to the first drain electrode; and a pixel electrode connected to the second drain electrode.

In another aspect of the present invention, a thin film transistor includes: a silicon nanowire on a substrate, the silicon nanowire having a central portion and respective side portions of the central portion; a gate insulating layer on the central portion; a gate electrode on the gate insulating layer; and a source electrode and a drain electrode spaced apart from the source electrode on the respective side portions, the source and drain electrodes directly contacting the silicon nanowire, respectively.

In another aspect of the present invention, an array substrate for a flat panel display device includes: a silicon nanowire on a substrate, the silicon nanowire having a central portion and respective side portions of the central portion; a gate insulating layer on the central portion; a gate electrode on the gate insulating layer; a first source electrode and a first drain electrode spaced apart from the first source electrode on the respective side portions, the first source and first drain electrodes directly contacting the silicon nanowire, respectively; a second source electrode connected to the first source electrode and a second drain electrode connected to the first drain electrode; and a pixel electrode connected to the second drain electrode.

In another aspect of the present invention, a method of fabricating a thin film transistor includes: disposing a silicon nanowire on a substrate, the silicon nanowire having a central portion and respective side portions of the central portion; forming a gate electrode on the central portion; and forming a source electrode and a drain electrode spaced apart from the source electrode on the respective side portions, the source electrode and the drain electrode electrically connected to the silicon nanowire, respectively.

In another aspect of the present invention, a method of fabricating an array substrate for a flat panel display device includes: disposing a silicon nanowire on a substrate, the silicon nanowire having a central portion and respective side portions of the central portion; forming a gate electrode on the central portion; forming a first source electrode and a first drain electrode spaced apart from the first source electrode on the respective side portions, the first source electrode and the first drain electrode electrically connected to the silicon nanowire, respectively; forming a second source electrode connected to the first source electrode and a second drain electrode connected to the first drain electrode; and forming a pixel electrode connected to the second drain electrode.

In another aspect of the present invention, a method of fabricating a thin film transistor includes: coating a solvent including a silicon nanowire on a substrate, the silicon nanowire having a central portion and respective side portions of the central portion; removing the solvent from the substrate except the silicon nanowire; sequentially forming a gate insulating layer and a gate electrode on the silicon nanowire on the central portion; and forming a source electrode and a drain electrode spaced apart from the source electrode on the respective side portions, the source and drain electrodes directly contacting the silicon nanowire.

In another aspect of the present invention, a method of fabricating an array substrate for a flat panel display device includes: coating a solvent including a silicon nanowire on a substrate, the silicon nanowire having a central portion and respective side portions of the central portion; removing the solvent from the substrate except the silicon nanowire; sequentially forming a gate insulating layer and a gate electrode on the central portion; forming a first source electrode and a first drain electrode spaced apart from the first source electrode on the respective side portions, the first source and first drain electrodes directly contacting the silicon nanowire; and forming a second source electrode connected to the first source electrode and a second drain electrode connected to the first drain electrode; and forming a pixel electrode connected to the second drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or similar parts.

A first embodiment according to the present invention includes a silicon nanowire as an active layer, and source and drain electrodes formed of the same material as the gate electrode through a same process.

FIGS. 6A to 6E are schematic cross-sectional views showing an array substrate having a TFT including a silicon nanowire in accordance with a manufacturing process according to a first embodiment of the present invention.

Figure 1:
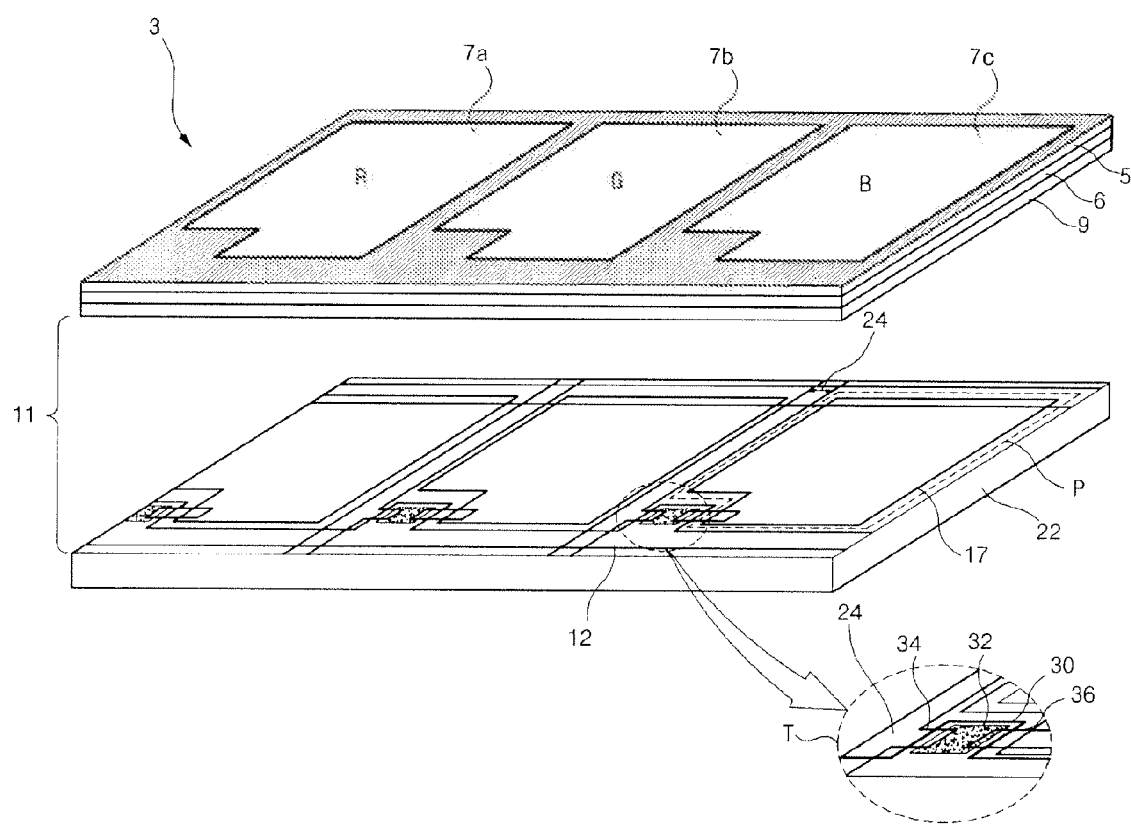
FIG. 1 is a schematic view of a structure of an LCD according to the related art.
Figure 2:
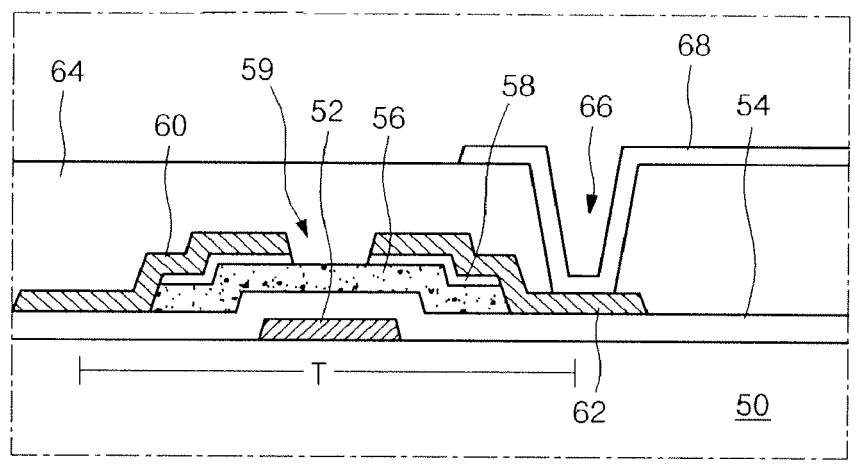
FIG. 2 is a schematic cross-sectional view of an inverted staggered type TFT according to the related art.
Figure 3A:
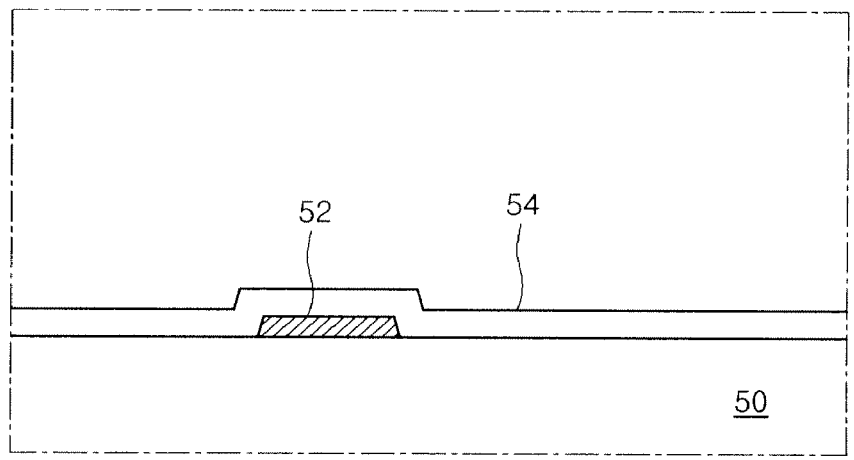
FIGS. 3A to 3E are schematic cross-sectional views showing an array substrate including an inverted staggered TFT in accordance with a manufacturing process thereof of the related art, respectively.
Figure 3B:
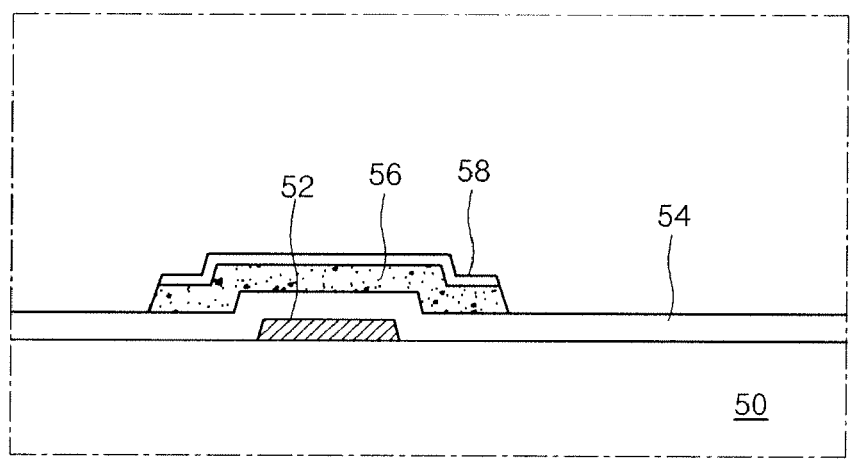
Figure 3C:
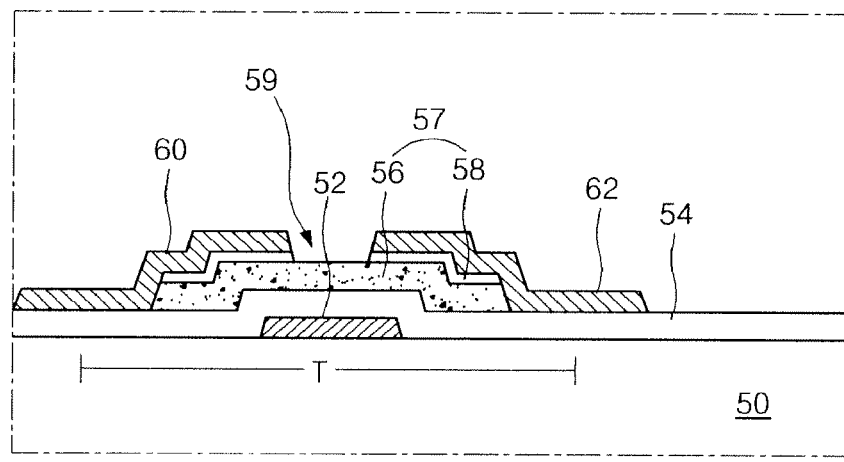
Figure 3D:
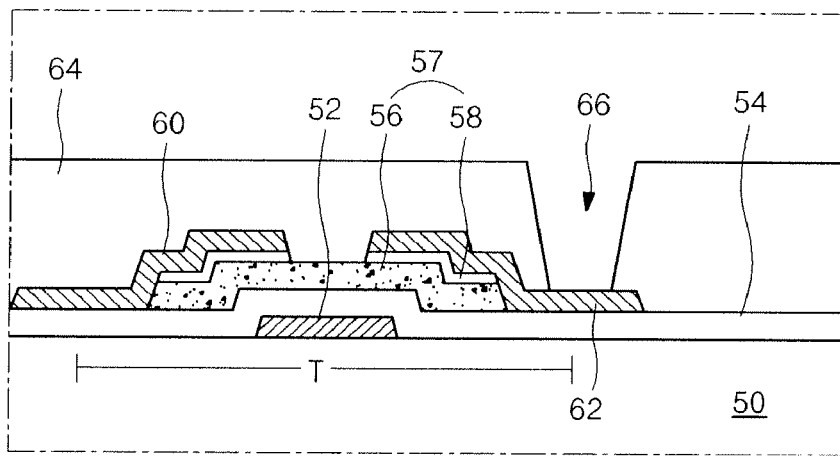
Figure 3E:
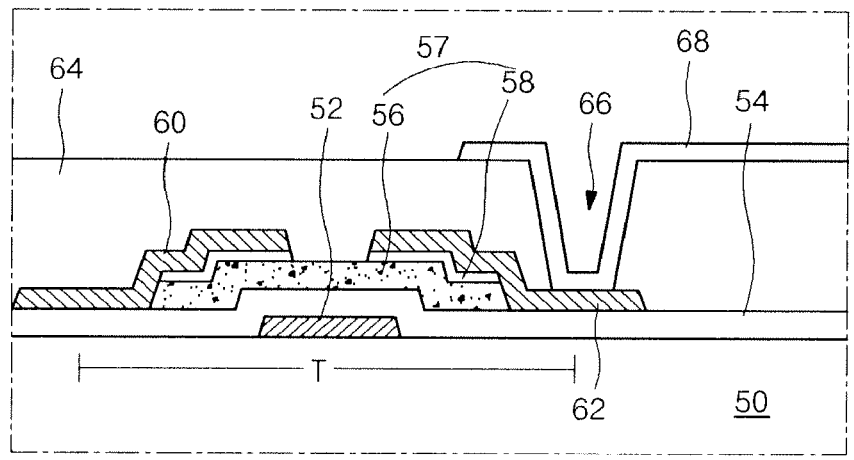
Figure 4:
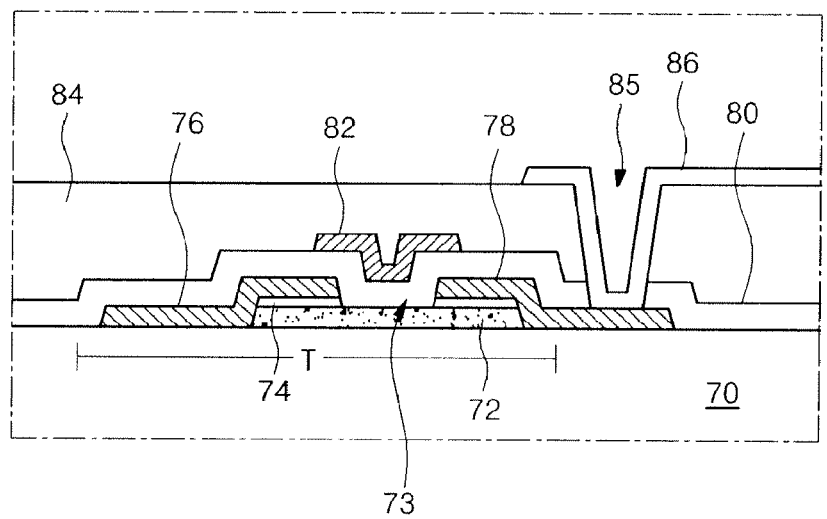
FIG. 4 is a schematic cross-sectional view of a top gate type TFT according to the related art.
Figure 5:
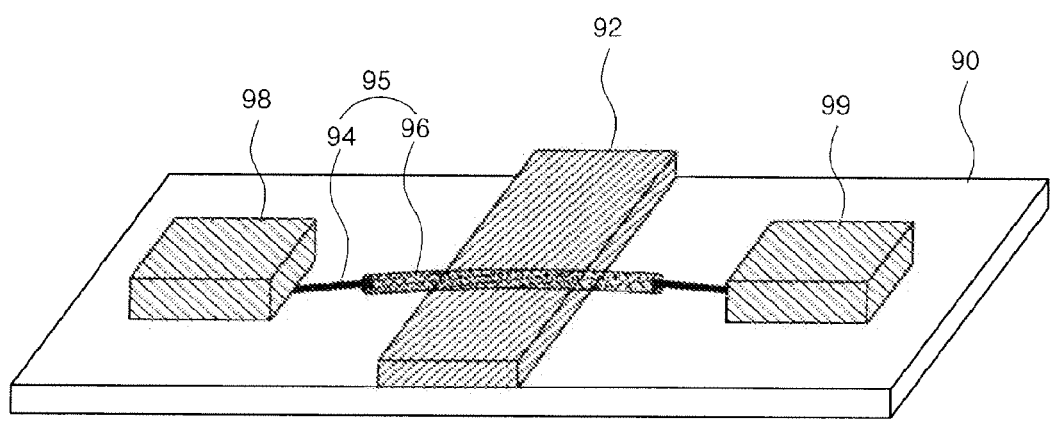
FIG. 5 is a schematic cross sectional view showing a structure of a TFT including a silicon nanowire according to the related art.
Figure 6A:
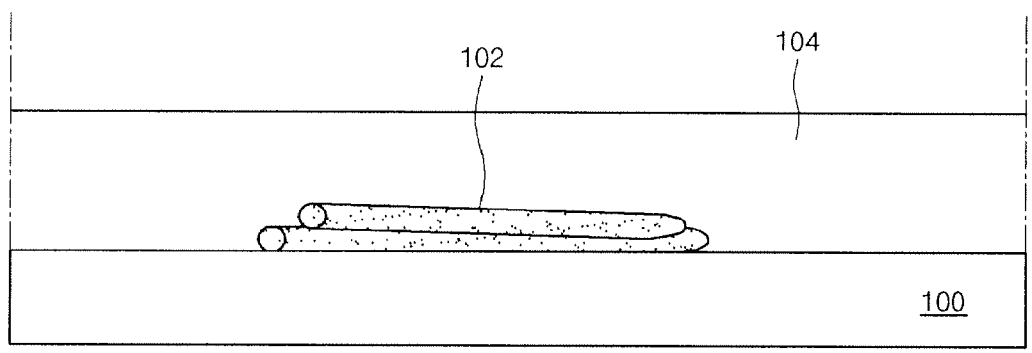
FIGS. 6A to 6E are schematic cross-sectional views showing an array substrate having a TFT including a silicon nanowire in accordance with a manufacturing process according to a first embodiment of the present invention.

In FIG. 6A, a silicon nanowire 102 is disposed on a substrate 100. Although not shown, for example, the silicon nanowire 102 is formed by depositing a catalyzer on a semiconductor substrate (not shown) and crystallizing the catalyzer using a reactive gas including silicon. This silicon nanowire 102 may be sprayed on the substrate 100 after depositing and crystallizing on the semiconductor substrate. Further, the silicon nanowire 102 has a rod shape as shown in FIG. 6A. Although not shown, the silicon nanowire 102 includes a core of a semiconductor material and an insulating layer surrounding the core to faun a coaxial structure between the core and the insulating layer.

For example, the core is formed by crystallizing the semiconductor material and the insulating layer is formed by crystallizing one of a silica and an alumina. Therefore, the core includes a crystalline silicon. Furthermore, the silicon nanowire 102 may consist of a plurality of silicon nanowires.

Next, a fixing layer 104 is formed by coating an organic insulating material such as benzocyclobutene (BCB) or acrylic resin on the substrate 100 where the silicon nanowire 102 is formed. The fixing layer 104 acts as fixing the silicon nanowire 102 to the substrate 100.

Figure 6B:
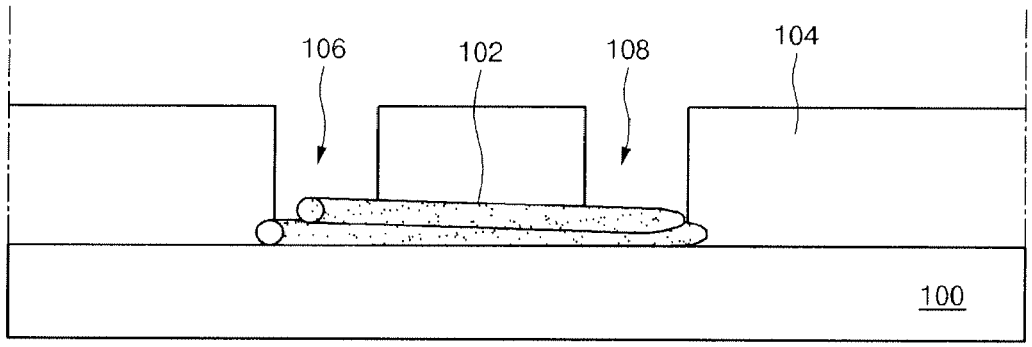

In FIG. 6B, first and second contact holes 106 and 108 are formed by etching the fixing layer 104 to expose respective side portions of the silicon nanowire 102. Forming the first and second contact holes 106 and 108 may include removing the insulating layer of the silicon nanowire 102.

The forming process of the fixing layer may be omitted as the case may be.

Figure 6C:
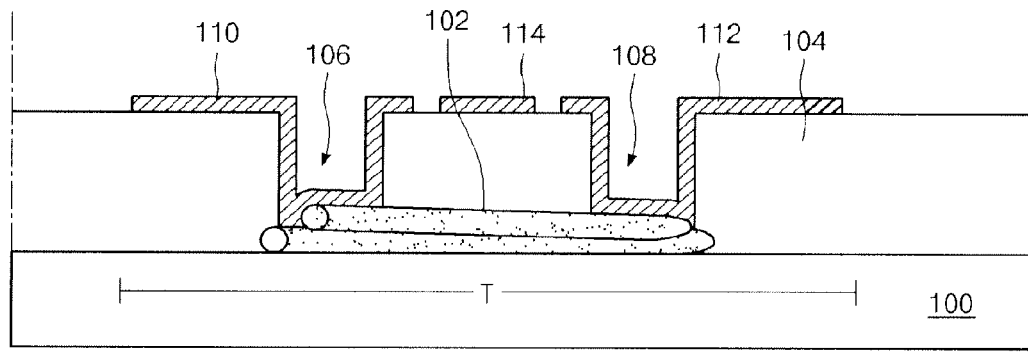

In FIG. 6C, a first source electrode 110, a first drain electrode 112 and a gate electrode 114 are formed by depositing a conductive metallic material such as aluminum (Al), Al alloy, copper, tungsten (W), molybdenum (Mo), titanium (Ti) or chromium (Cr) on the substrate 100 having the fixing layer 104 formed thereon. Here, the first source and the first drain electrodes 110 and 112 are connected to the silicon nanowire 102 via the first and second contact holes 106 and 108, respectively, and the gate electrode 114 is disposed at an interval space between the first source electrode 110 and the first drain electrode 112. That is, the first source electrode 110, the gate electrode 114 and the first drain electrode 112 are spaced apart from each other.

Further, a silicide layer (not shown) may be formed at an interface between the silicon nanowire 102 and the first source electrode 110 and between the silicon nanowire 102 and the first drain electrode 112. Accordingly, the silicide layer may act as an ohmic contact layer, thereby omitting an additional step of forming the ohmic contact layer.

The silicon nano wire 102, the gate electrode 114, the first source electrode 110 and the first drain electrode 112 constitute a TFT T. It is noted that the first source electrode 110 and the first drain electrode 112 are formed through the same process as the gate electrode 114, thereby reducing the number of the TFT process steps.

Figure 6D:
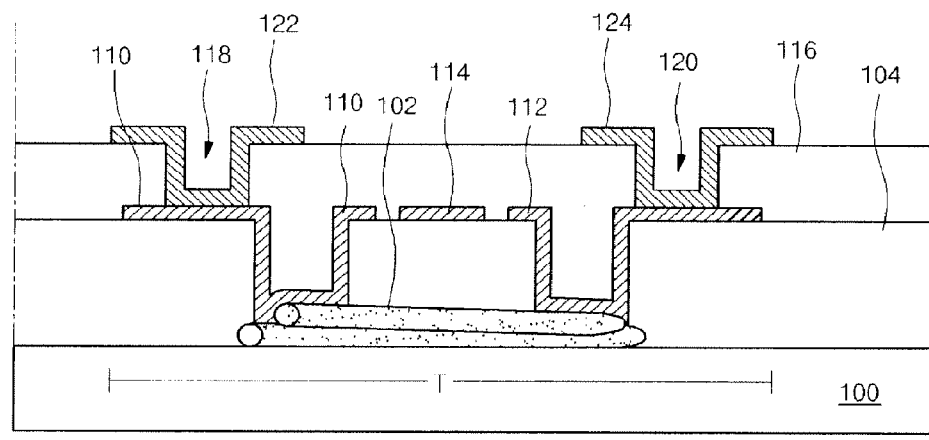

In FIG. 6D, a gate insulating layer 116 is formed by depositing an inorganic insulating material such as silicon nitride or silicon oxide on the substrate 100 having the first source and the first drain electrodes 110 and 112 and the gate electrode 114 thereon. Further, third and fourth contact holes 118 and 120 are formed by etching the gate insulating layer 116 to expose a portion of the first source and the first drain electrodes 110 and 112.

Next, a second source electrode 122 and a second drain electrode 124 are formed by depositing and patterning a conductive metallic material such as the same material as that of the first source and the first drain electrodes 110 and 112 on the substrate 100 having the first source and the first drain electrodes 110 and 112 thereon. Here, the second source electrode 122 is connected to the first source electrode 110 via the third contact hole 118 and the second drain electrode 124 is connected to the first drain electrode 112 via the fourth contact hole 120.

Although not shown, a data line may be formed during forming the second source and the second drain electrodes 122 and 124 as one body with the second source electrode 122.

Figure 6E:
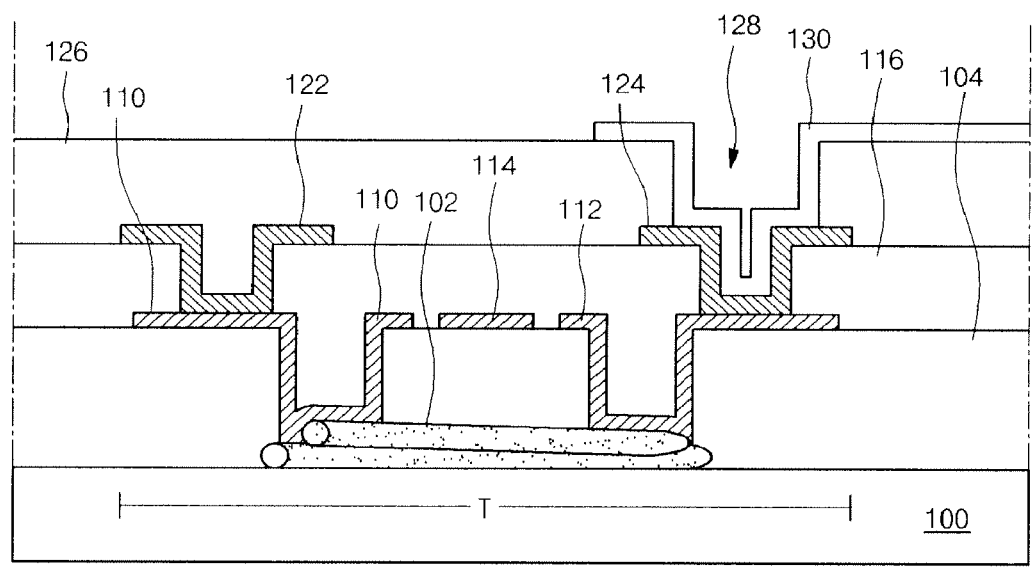

In FIG. 6E, a passivation layer 126 is formed by depositing and patterning an inorganic material such as silicon nitride or silicon oxide or by coating and patterning an organic material such as benzocyclobutene (BCB) or acrylic resin on the substrate 100 having the second source and the second drain electrodes 122 and 124 thereon.

Next, a drain contact hole 128 is formed by etching the passivation layer 126 to expose a portion of the second drain electrode 124.

A pixel electrode 130 is formed by depositing a transparent conductive material such as indium tin oxide (ITO) or indium zinc oxide (IZO) on an entire surface of the substrate 100 having the passivation layer 126 thereon. Here, the pixel electrode 130 is connected to the second drain electrode 124 via the drain contact hole 128.

Through the mentioned process, the array substrate having the TFT T including the silicon nanowire 102 is manufactured and is utilized as a switching element or a driving element.

A second embodiment has a feature such that a silicon nanowire is formed by spraying on a substrate.

FIGS. 7A to 7F are schematic cross sectional views showing an array substrate including a TFT having a silicon nanowire in accordance with a manufacturing process according to a second embodiment of the present invention.

Figure 7A:
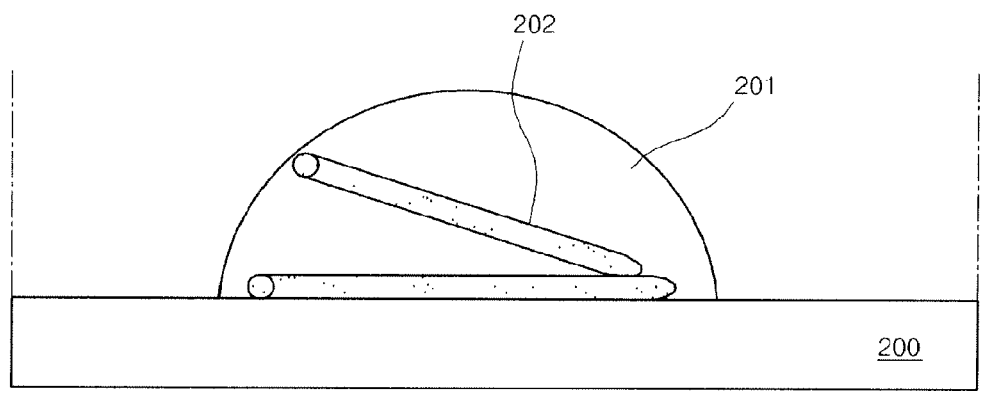
FIGS. 7A to 7F are schematic cross sectional views showing an array substrate including a TFT having a silicon nanowire in accordance with a manufacturing process according to a second embodiment of the present invention.

In FIG. 7A, a silicon nanowire 202 is disposed on a substrate 200, for example, a solvent 201 having the silicon nanowire 202 and surfactant (not shown) is prepared and the solvent 201 may be coated by spraying on the substrate 200. For example, the silicon nanowire 202 may be formed by depositing a catalyzer having a nanoscale size on a semiconductor substrate (not shown) and by crystallizing the catalyzer using a reactive gas including silicon before preparing the solvent 201.

Substantially, although not shown, the silicon nanowire 202 includes a core and an insulating layer surrounding the core so as to form a coaxial structure therebetween. Further, the silicon nanowire 202 has a rod shape. Furthermore, the silicon nanowire 202 consists of a plurality of silicon nanowires.

Figure 7B:
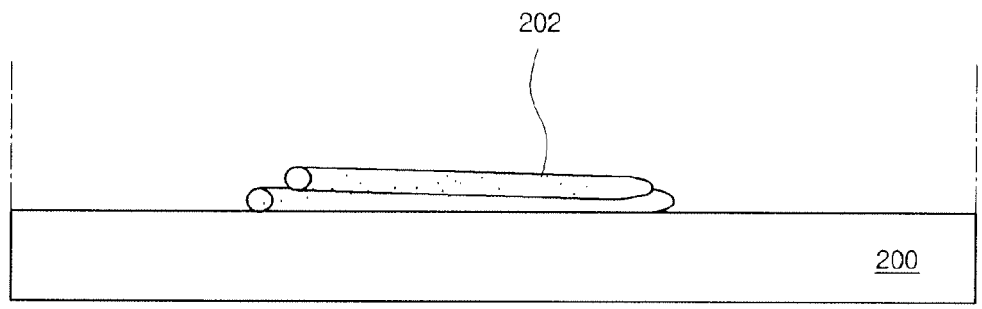

In FIG. 7B, through the step of FIG. 7A, the residual solvent (not shown) is removed by heating under a temperature less than about 100 degree Celsius from the substrate 200 except the silicon nanowire 202. Here, the step of heating may be performed with respect to an entire surface of the substrate 200. After this step, the silicon nanowire 202 is disposed along a parallel direction to a surface of the substrate 202.

Figure 7C:
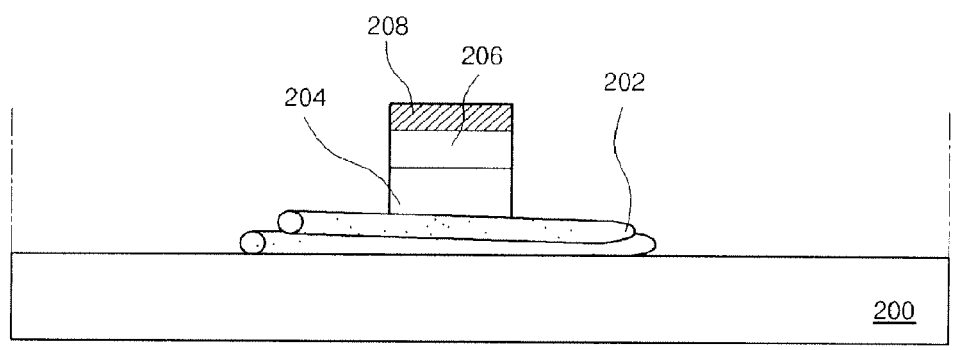

In FIG. 7C, a fixing layer 204, a gate insulating layer 206 and a gate electrode 208 are sequentially deposited on a central portion of the silicon nanowire 202.

For example, the fixing layer 204 and the gate insulating layer 206 are simultaneously deposited and patterned through a same process. Here, the insulating layer surrounding the crystalline silicon in the silicon nanowire 202 may be removed through patterning the fixing layer 204 and the gate insulating layer 206 or by the gate electrode 208 acting as an etching stopper after patterning the gate electrode 208.

For example, the fixing layer 204 is formed of an organic insulating material such as benzocyclobutene (BCB) or acrylic resin and acts as fixing the silicon nanowire 202.

However, the forming process of the fixing layer 204 may be omitted as the case may be.

Figure 7D:
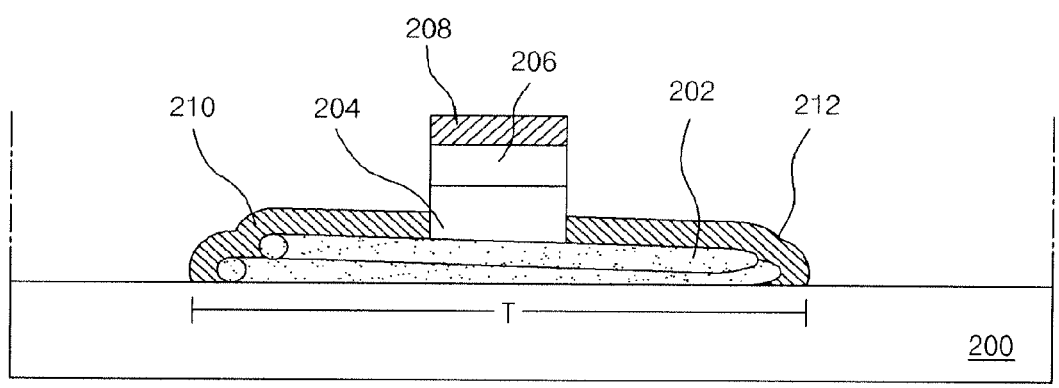

In FIG. 7D, a first source electrode 210 and a first drain electrode 212 are formed by depositing and patterning a conductive metallic material such as aluminum (Al), Al alloy, copper, tungsten (W), molybdenum (Mo), titanium (Ti) or chromium (Cr) on the substrate 200 where the gate electrode 208 is formed. Here, the first source and the first drain electrodes 210 and 212 are spaced apart from each other by the fixing layer 204, the gate insulating layer 206 and the gate electrode 208. Here, the first source and the first drain electrodes 210 and 212 directly cover the exposed silicon nanowire 202 so as to be directly connected to a portion of the silicon nanowire 202.

Further, although not shown, a silicide layer may be formed at an interface between the silicon nano wire 202 and the first source electrode 210 and between the silicon nano wire 202 and the first drain electrode 212. The silicide layer may act as an ohmic contact layer regarding the first source electrode 210 and the first drain electrode 212, therefore, an additional ohmic contact layer is unnecessary.

Using the above-described processes, the silicon nanowire 202, the gate electrode 208, the first source electrode 210 and the first drain electrode 212 constitute a TFT T. Accordingly, since the first source electrode 210 and the first drain electrode 212 are formed through the same process as the gate electrode 208, the process time and the product cost of the TFT T can be reduced.

Figure 7E:
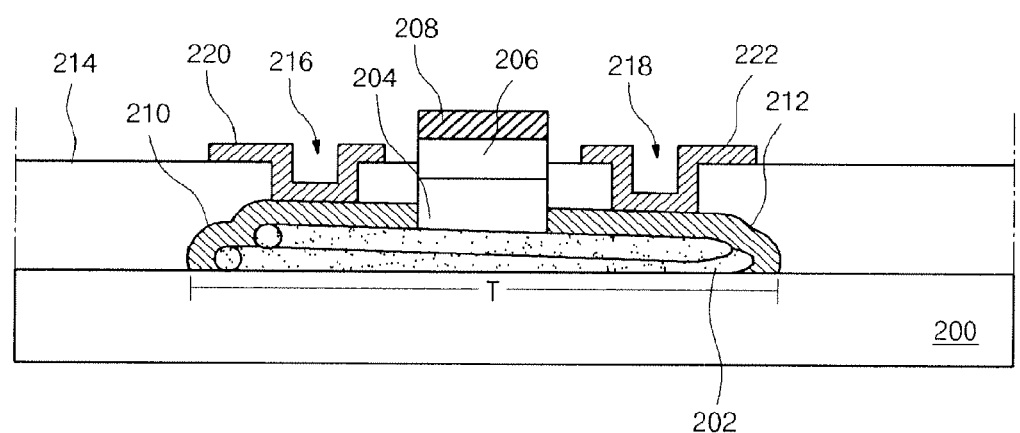

In FIG. 7E, an interlayer insulating film 214 is formed by depositing and patterning an inorganic insulating material such as silicon nitride (SiNx) or silicon oxide (SiOx) on the substrate 200 where the TFT T is formed thereon. Through the step, the interlayer insulating film 214 has first and second contact holes 216 and 218 that expose portions of the first source and the first drain electrodes 210 and 212, respectively.

Next, a second source electrode 220 and a second drain electrode 222 are formed by depositing and patterning a conductive metallic material, for example, the same material as that of the first source and the first drain electrodes 210 and 212 on the substrate 200 where the interlayer insulating film 214 is formed. Here, the second source electrode 220 is connected to the first source electrode 210 via the first contact hole 216 and the second drain electrode 222 is connected to the first drain electrode 216 via the second contact hole 218.

Figure 7F:
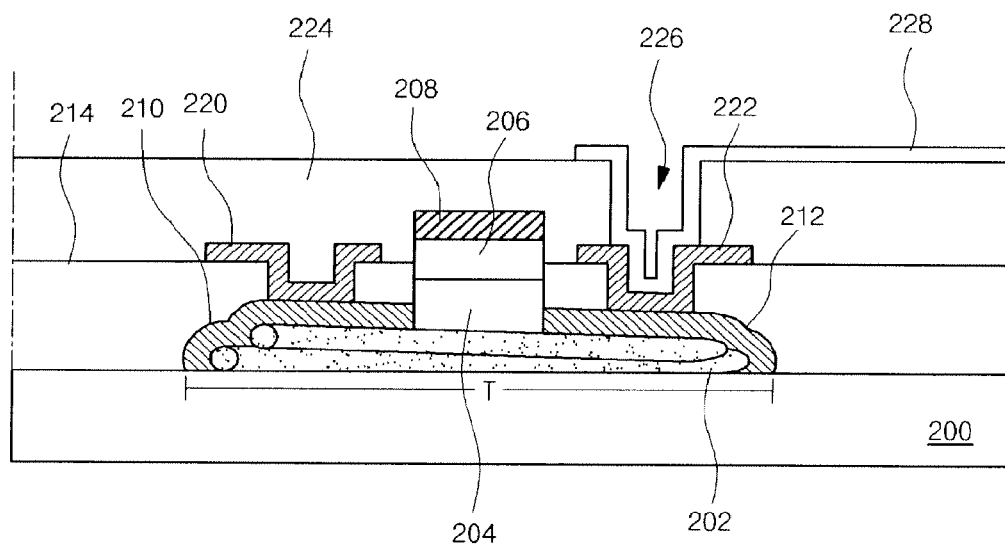

In FIG. 7F, a passivation layer 224 is formed by depositing an inorganic insulating material such as silicon nitride (SiNx) or silicon oxide (SiOx) or by coating an organic insulating material such as benzocyclobutene (BCB) or acrylic resin on the substrate 200 where the second source and the second drain electrodes 220 and 222 are formed. Here, the passivation layer 224 is patterned so as to have a drain contact hole 226 that exposes a portion of the second drain electrode 222.

Next, a pixel electrode 228 is formed by depositing and patterning a transparent conductive material such as indium tin oxide (ITO) or indium zinc oxide (IZO) on the passivation layer 224. Here, the pixel electrode 228 is connected to the second drain electrode 222 via the drain contact hole 226.

Through the mentioned process, the array substrate including the TFT having the silicon nanowire according to the second embodiment can be manufactured.

The TFT according to the present invention has a feature such that a silicon nanowire is utilized instead of a semiconductor layer and the silicon nanowire is fixed and reinforced by a fixing layer, thereby stabilizing the operation of the TFT.

Accordingly, the TFT is independently formed from the array elements, therefore, the source electrode, the drain electrode and the gate electrode are formed of a same material through a same process. Consequently, the process time and the process cost of the TFT can be reduced through the simpler process than that of the related art.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor, comprising:
a silicon nanowire on a substrate, the silicon nanowire having a central portion and respective side portions of the central portion;
a fixing layer on the central portion of the silicon nanowire and the substrate, the fixing layer fixing the silicon nanowire to the substrate;
a gate electrode on the fixing layer over the central portion;
a first source electrode and a first drain electrode on the fixing layer over the respective side portions of the silicon nanowire, the first electrode spaced apart from the first source electrode, the first source electrode and the first drain electrode electrically connected to the silicon nanowire; and
a gate insulating layer on the gate electrode, the first source electrode and the first drain electrode.

2. The thin film transistor according to claim 1, wherein the silicon nanowire includes a core of a semiconductor material and an insulating layer surrounding the core.

3. The thin film transistor according to claim 2, wherein the silicon nanowire has a coaxial structure between the core and the insulating layer.

4. The thin film transistor according to claim 1, wherein the silicon nanowire has a rod shape.

5. The thin film transistor according to claim 1, wherein the silicon nanowire consists of a plurality of silicon nanowires.

6. The thin film transistor according to claim 1, wherein the gate electrode is made of the same material as the first source and first drain electrodes.

7. The thin film transistor according to claim 1, wherein the fixing layer includes first and second contact holes that expose portions of the first source and first drain electrodes, respectively, and the first source and first drain electrodes are connected to the silicon nanowire via the first and second contact holes, respectively.

8. The thin film transistor according to claim 1, wherein the fixing layer includes an organic insulating material.

9. The thin film transistor according to claim 8, wherein the organic insulating material includes one of benzocyclobutene (BCB) and acrylic resin.

10. A thin film transistor, comprising:
a silicon nanowire on a substrate, the silicon nanowire having a central portion and respective side portions of the central portion;
a fixing layer on the central portion of the silicon nanowire and the substrate, the fixing layer fixing the silicon nanowire to the substrate;
a gate insulating layer on the fixing layer;
a gate electrode on the gate insulating layer, the respective side portions of the silicon nanowire exposed outside the fixing layer, the gate insulating layer and the gate electrode; and
a first source electrode and a first drain electrode spaced apart from the first source electrode on respective side portions, the first source and first drain electrodes directly contacting the respective side portions of the silicon nanowire exposed outside the fixing layer, the gate insulating layer and the gate electrode.

11. The thin film transistor according to claim 10, further comprising a fixing layer between the central portion of the silicon nanowire and the gate insulating layer.

12. The thin film transistor according to claim 1, further comprising a second source electrode connected to the first source electrode and a second drain electrode connected to the first drain electrode.

13. The thin film transistor according to claim 10, further comprising a second source electrode connected to the first source electrode and a second drain electrode connected to the first drain electrode.

* * * * *